United States Patent [19]
Rzedzian

[11] Patent Number: 4,767,991
[45] Date of Patent: Aug. 30, 1988

[54] METHOD OF HIGH SPEED IMAGING WITH IMPROVED SPATIAL RESOLUTION USING PARTIAL K-SPACE ACQUISITIONS

[75] Inventor: Richard R. Rzedzian, Lexington, Mass.

[73] Assignee: Advanced NMR Systems, Inc., Woburn, Mass.

[21] Appl. No.: 85,568

[22] Filed: Aug. 17, 1987

Related U.S. Application Data

[63] Continuation-in-part of Ser. No. 937,529, Dec. 3, 1986, Pat. No. 4,740,748.

[51] Int. Cl.$^4$ .......................................... G01R 33/20
[52] U.S. Cl. ..................................... 324/312; 128/653
[58] Field of Search ....................... 324/307, 309, 312; 128/653

[56] References Cited

U.S. PATENT DOCUMENTS 4,678,996 7/1987 Haacke et al. ..................... 324/312
4,727,325 2/1988 Matsui et al. ..................... 324/312

Primary Examiner—Stewart J. Levy
Assistant Examiner—Kevin D. O'Shea
Attorney, Agent, or Firm—Ostrolenk, Faber, Gerb & Soffen

[57] ABSTRACT

A method of high-speed imaging is employed in which less than 100% of the spatial frequency domain (k-space) is sampled. In one embodiment, the trajectory extends over the k-space origin, and the information acquired from the extension is used to compensate for any phase errors. If the same number of points are collected as in a full k-space acquisition, signal bandwidth is maintained, and spatial frequency response is increased. In a second embodiment, two or more partial k-space acquisitions are performed and then pieced together in a "mosaic" prior to Fourier transformation. In a further embodiment, partial k-space acquisitions in the direction of the readout gradient are combined with interleaved acquisitions in the direction of the phase-encoding gradient to avoid discontinuities.

11 Claims, 11 Drawing Sheets

"UNFILLED"

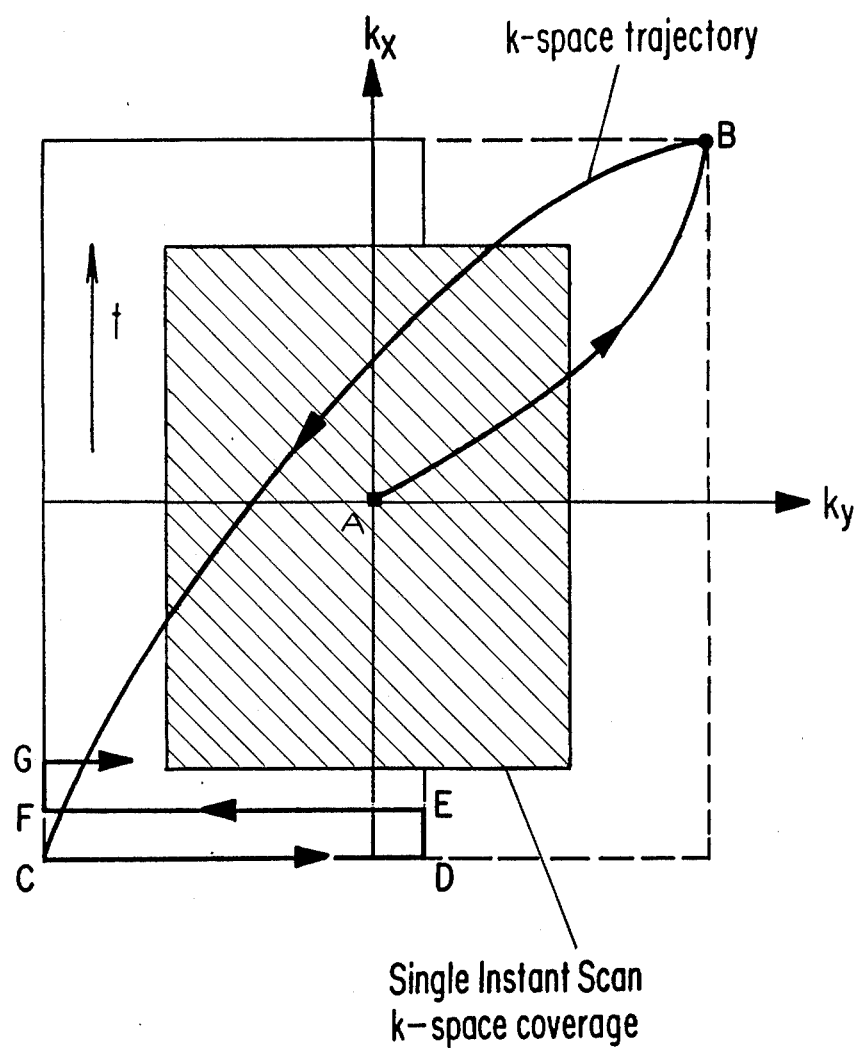

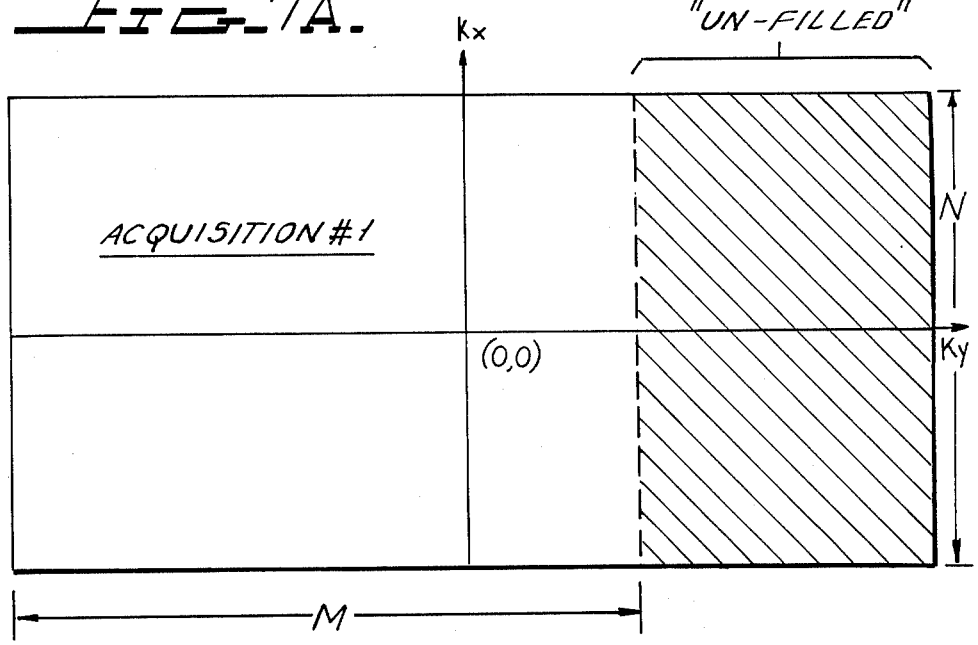
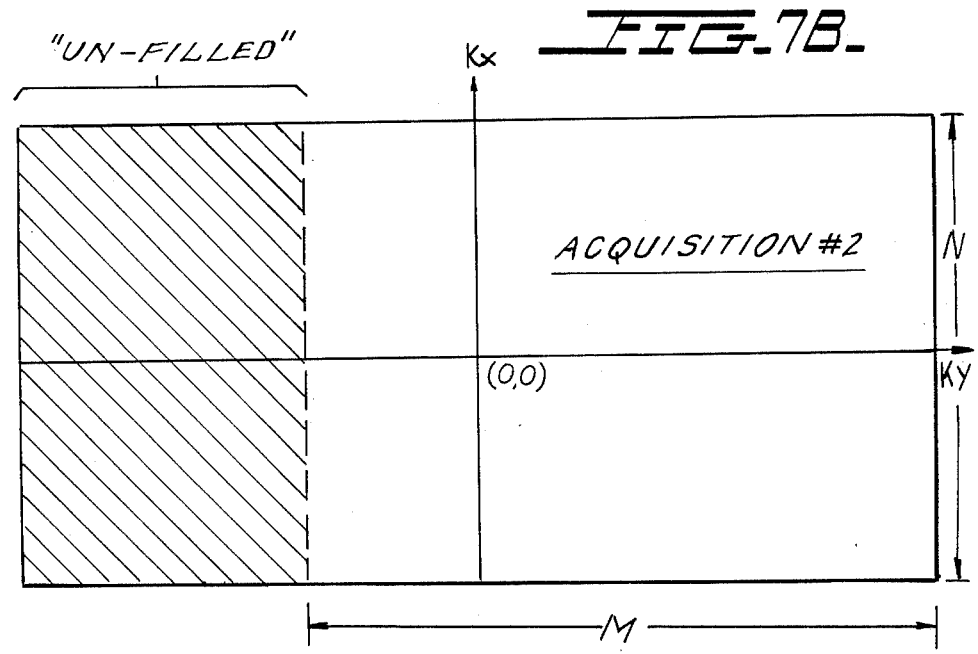

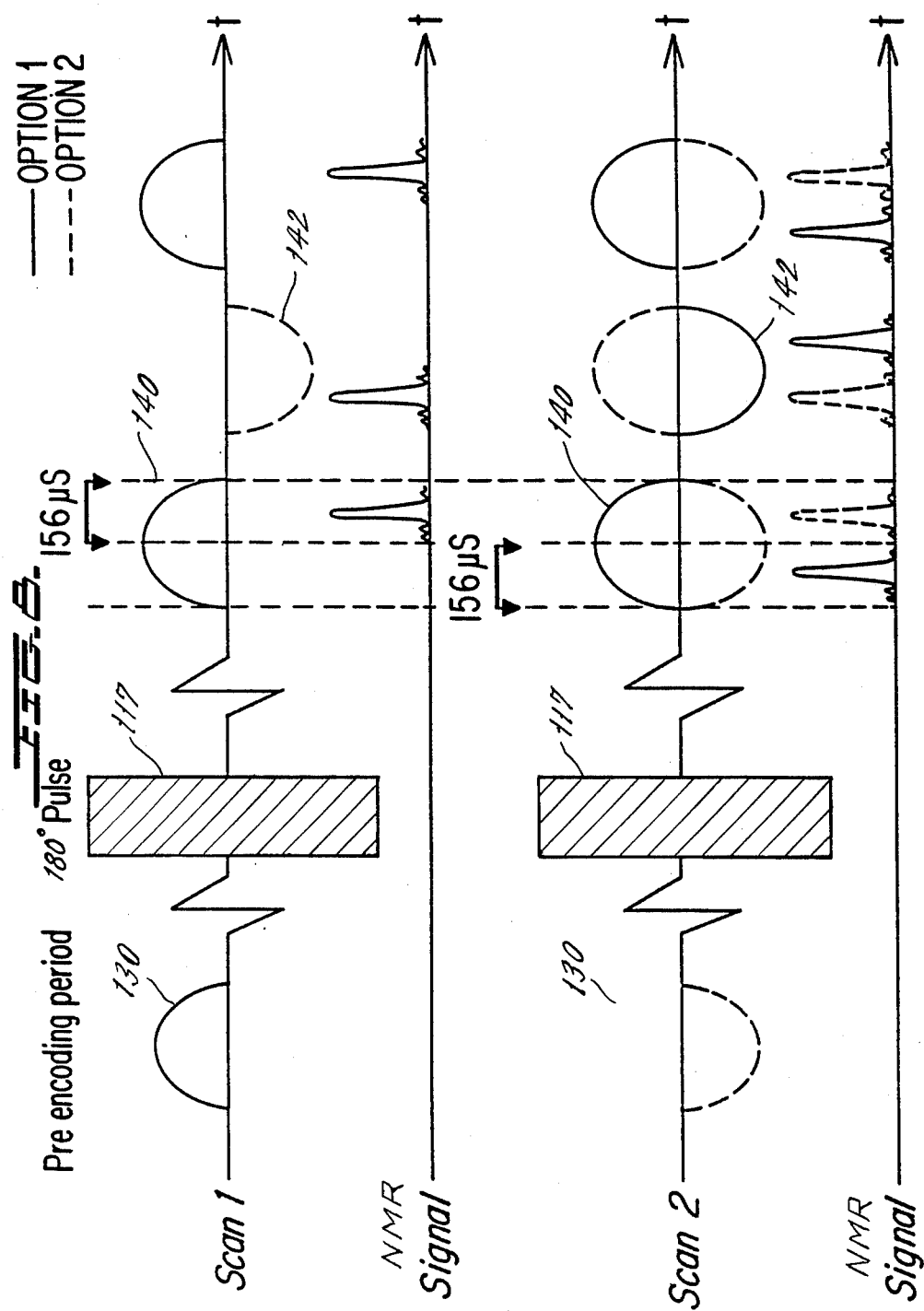

Single Instant Scan k-space coverage

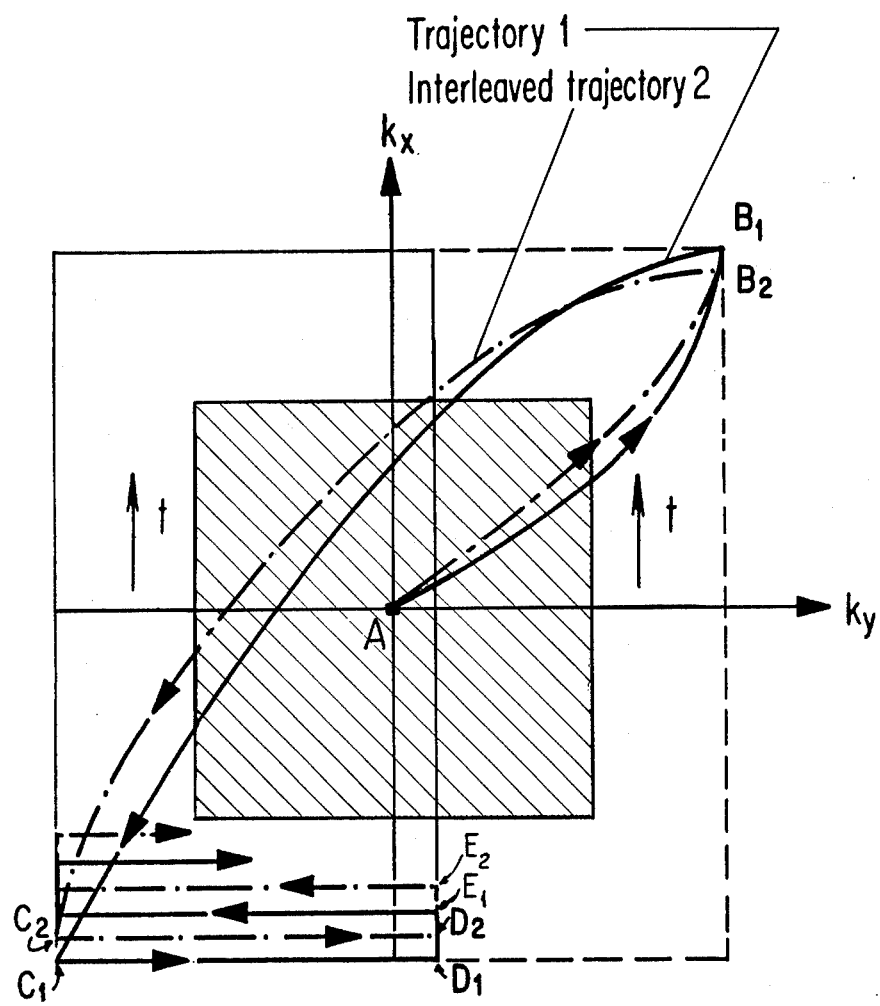

METHOD OF HIGH SPEED IMAGING WITH IMPROVED SPATIAL RESOLUTION USING PARTIAL K-SPACE ACQUISITIONS

RELATED APPLICATION

This is a continuation-in-part application of Ser. No. 937,529, filed Dec. 3, 1986, now U.S. Pat. No. 4,740,748, entitled "Method of High Speed Magnetic Resonance Imaging", assigned to the same assignee as the present application, the disclosure of which is herein incorporated by reference.

BACKGROUND OF THE INVENTION

Primary among the factors which have slowed down the rate of growth of magnetic resonance imaging (MRI) technology in the diagnostic imaging arena are concerns relating to its relatievly high cost (up to about $800 per patient study), and its limited applicability to the study of organ systems subject to significant physiological motion, especially the heart and abdomonial organs. Initial studies on normal volunteers indicate that the method set forth in the above-identified parent application, Ser. No. 937,529, filed Dec. 3, 1986, now U.S. Pat. No. 4,740,748, (hereinafter referred to as "Instant Scan") may help alleviate both of these problems by virtue of its extremely rapid data acquisition time which can "freeze" physiological motion and may improve patient throughput.

Referring to FIG. 1, in the Instant Scan method, as described in the parent application, the object 12 is placed in a static magnetic field $B_o$ along a first axis, conventionally referred to herein as the "z" axis. The magnetic field $B_o$ along the z axis, generated by body magnet 14, has an intensity in the range from about 0.5 to 5 Tesla. Nuclear spins are excited in an image area in a selected plane 10 of the object, by superimposing on the static magnetic field in the z direction, via coil structure 16, a first gradient field 114 (FIG. 2), termed a slice-selection gradient, and simultaneously applying a spectrally-tailored radio frequency (RF) excitation pulse 116, whereby free induction decay signals are produced by the excited nuclear spins. During the RF excitation, dephasing of nuclear spins may occur across the width of the selected plane, and rephasing of the nuclear spins is required. Rephasing may be achieved either by reversing the first gradient field, shown as 114a, or by reapplying a similar first gradient waveform 114b following the application of a 180° pulse.

Second and third magnetic gradients, termed phase-encoding and readout gradients, respectively, are applied from coil structure 16 in the x and y directions, respectively. As is conventional, the x, y, and z directions are assumed to be mutually orthogonal. The selected area 10 for the magnetic resonance image is in the x-y plane, which is commonly referred to as the transverse plane.

Obviously, the above-recited coordinate assignment of the first, second and third gradient fields as applied in the x, y and z directions is not exclusive. For example, a defined area in the x-z or y-z planes may be selected by assuming that the first gradient field (slice-selection gradient) is applied in the y or x directions respectively, with the second (phase-encoding) and third (readout) gradients applied in the x and y or y and z direction respectively. The defined area will then be a coronal or sagittal plane. Furthermore, in general, the first, second and third gradients need not necessarily lie along any of the directions x, y, or z defined above. Whilst maintaining their mutual orthogonality, the said first, second and third gradients can be rotated to point along a transformed coordinate set $x_1$, $y_1$, and $z_1$, in which case arbitrarily oriented "oblique" planes may be selected and imaged from a viewpoint perpendicular to the plane. Finally, the first, second and third gradients need not necessarily be mutually orthogonal, in which case, for instance, arbitrarily oriented oblique planes may be selected and then obliquely imaged, i.e., from a viewpoint oblique to the plane. These variations of coordinate assignments are well-known to those skilled in the art.

The time-varying phase-encoding and readout gradients perform the function of changing the phases of the temporal nuclear signals in a spatially variant manner, i.e., determining the points in the spatial frequency domain (k-space) which are sampled at specific times during the acquisition of date. The resulting trajectory of sample points in k-space is known as the k-trajectory.

The decoding process involves several steps of initial processing followed by the operation of two dimensional Fourier transform, and yields a discrete image which is an estimate of the original spatial distribution.

Referring again to FIG. 2, in order to set the point in k-space at which sampling will begin, an encoding sequence occurs prior to sampling. Thereafter, a radio frequency signal 117 is applied to the object to subsequently rephase any of the subject nuclear spins that have become dephased due to non-uniformities in the static magnetic field. Next, the data are sampled by a sequence in which phase encoding and readout gradients 150 and 140/142, respectively, are alternatively applied (with possible overlap) such that a rectilinear scan of k-space is performed. Samples of $k_x$ are taken in real time (via application of the phase-encoding gradient). The orthogonal dimension, $k_y$, is scanned (via applicaiton of the readout gradient) in the "instant" between each pair of $k_x$ sample points. Thus, for each value of $k_x$, a complete $k_y$ line is collected. Using this technique, a total scan of k-space yielding a 64×128 image is achieved in as little as 26 milliseconds. The entire sampling sequence, including the encoding period and the application of the radio frequency pulse, occurs with an imaging period of less than about 100 milliseconds.

However, the dramatic improvement in scan times using the above-described Instant Scan technique is achieved only at the expense of a reduction in signal-to-noise ratio (SNR) and/or spatial resolution. In circumstances where body motion is not a problem, this reduction may not be acceptable. In such situations, it is preferable to spend more time acquiring data and regain the spatial resolution. The following variants of the Instant Scan technique have therefore been developed to provide a set of choices among spatial resolutions, total study time, and SNR, which the physician can select and tailor to the particular clinical application.

SUMMARY OF THE INVENTION

In a first embodiment of the invention, the Instant Scan technique is employed in a partial acquisition of k-space in either of the x or y dimensions. The sampling trajectory in a partial scan is less than 100%, but preferably extends over more than half of k-space. The informatin acquired from the extension of the sampling trajectory over the origin is used to compensate for any phase errors introduced. Since each line of k-space requires approximately 400 microseconds, elimination of $k_x$ lines in a partial $k_x$ acquisition saves imaging time.

A partial k-space acquisition can be conducted so that the same number of points are collected as in a previous full k-space acquisition, thus increasing spatial frequency response, while maintaining signal bandwidth. This technique therefore produces a higher resolution Instant Scan image in "one shot", but with a lower SNR.

In a further embodiment of the invention, two, four or more partial Instant Scan acquisitions are performed on different portions of k-space with an inter-acquisition delay of TR. The acquired portions are pieced together in a k-space patchwork or "mosaic" prior to Fourier transformation. The coverage of k-space in this "Mosaic Scan" technique can therefore be 100%, but multiple acquisitions are required. The SNR loss is partially regained because (a) all of k-space is filled; (b) because the low spatial frequencies are effectively signal-averaged; and (c) several acquisitions are now contributing to one image.

A characteristic of any data acquisition in MRI that must be addressed in the Mosaic Scan technique is that each constituent acquisition has $T_2$ decays associated with it from the sample, and when acquisitions are mosaicked together these $T_2$ decays may cause the formation of a discontinuous function. This effect is significant only in the $k_x$ dimension, which is acquired in "real time". Additionally, regions of magnetic susceptibility may exist in the subject, and also magnetic field non-uniformities can cause dephasing of the signal which is rephased as a spin echo by the application of the 180° RF pulse. Accordingly, in a further embodiment of the invention, a partial k-space acquisition is done called Mosaicked-Echo Scan Hybrid (MESH), wherein the x dimension is filled by interleaving or "meshing" lines from subsequent acquisitions. This allows for the piecing together of more than two portions of data in the $k_x$ dimension in the presence of $T_2$ decays and ensures that the spin echo is centered around $k_x=0$. Between Mosaic Scan and MESH, decays due to both field inhomogeneities and $T_2$ can be treated optimally.

Other objects, features and advantages of the invention will become apparent from the following description of the preferred embodiments of the invention, considered in connection with the accompanying drawings and appended claims.

BRIEF DESCRIPTION OF THE DRAWINGS

FIG. 6 shows the initial trajectory and coverage of the spatial frequency domain in a 2-Tile Mosaic Scan.

FIGS. 7A-7C show the sequential coverage of the spatial frequency domain in a 2-Tile Mosaic Scan.

FIG. 8 shows the pulse sequence and signal for the 2-Tile Mosaic Scan of FIGS. 6 and 7A-7C.

FIG. 10 shows the initial trajectories and coverage of the spatial frequency domain in a 4-Pulse MESH Scan.

DETAILED DESCRIPTION OF THE PREFERRED EMBODIMENTS

The present invention is described below in four sections. First, a full k-space acquisition, as set forth in the parent patent application is described. Second, partial k-space acquisition in both the $k_x$ and $k_y$ dimensions is described. Next, the Mosaic Scan technique is set forth, in which partial k-space acquisitions are pieced together in a k-space patchwork prior to Fourier transformation. Finally, the MESH technique is described, which avoids discontinuity problems stemming from excessive $T_2$ decay in partial $k_x$ acquisitions.

The Instant Scan Technique

Figure 1:
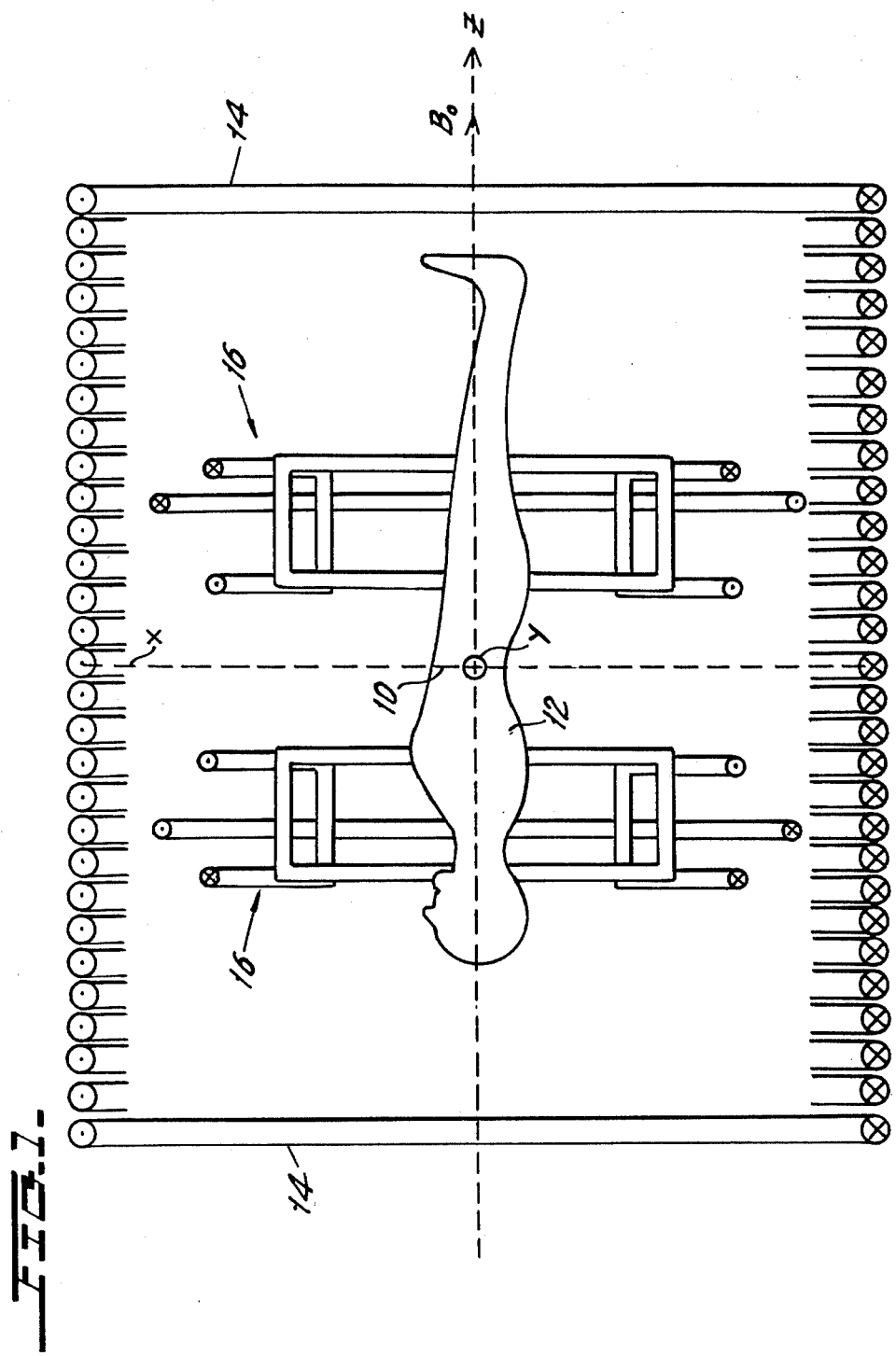
FIG. 1 is a simplified view of an object being imaged positioned within a magnet, illustrating the conventional spatial coordinate system x, y, z for the magnetic field gradients referred to throughout the specification and claims.
Figure 2:
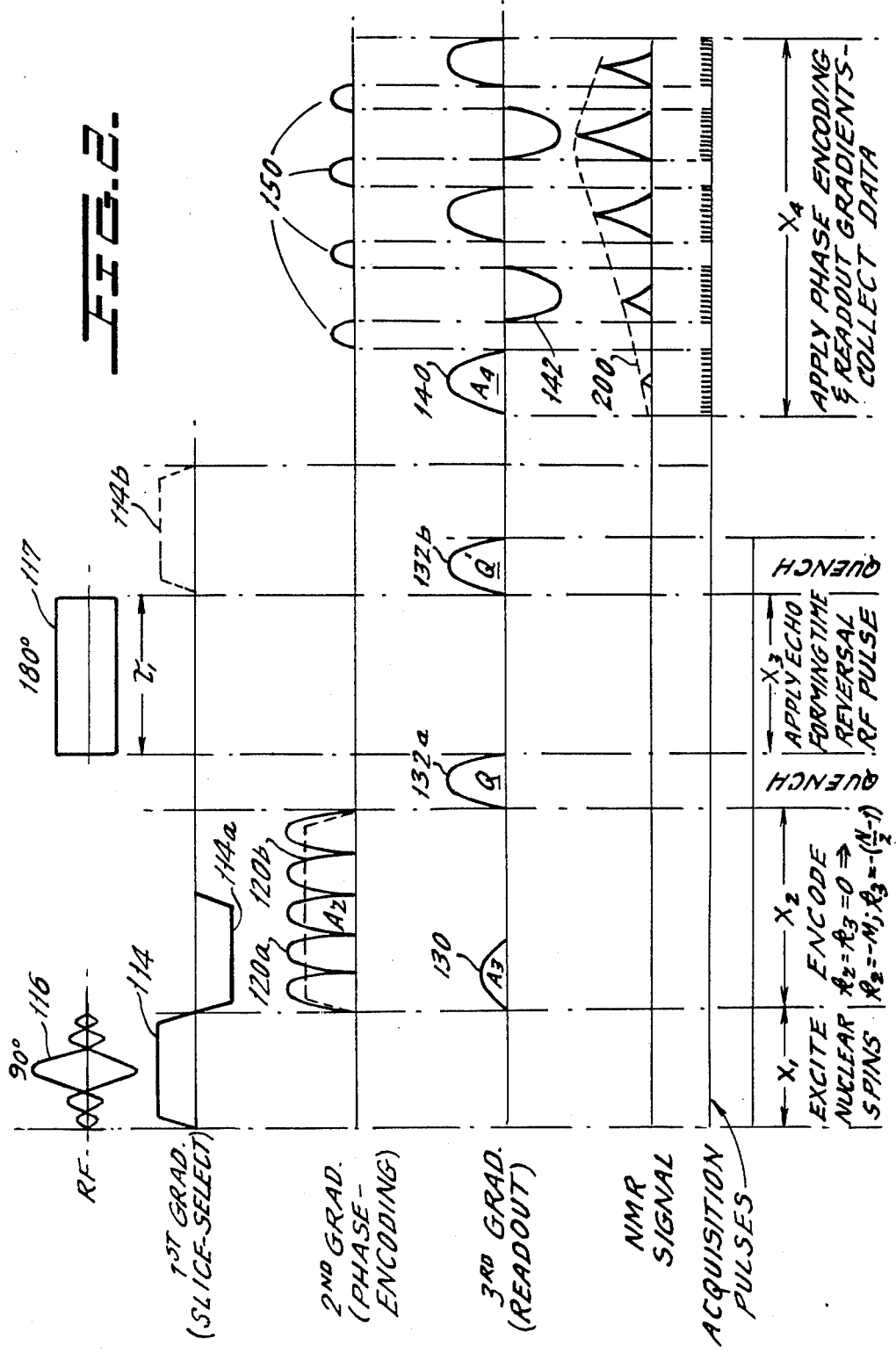
FIG. 2 shows the preferred pulse sequence for carrying out the method of the invention.
Figure 3:
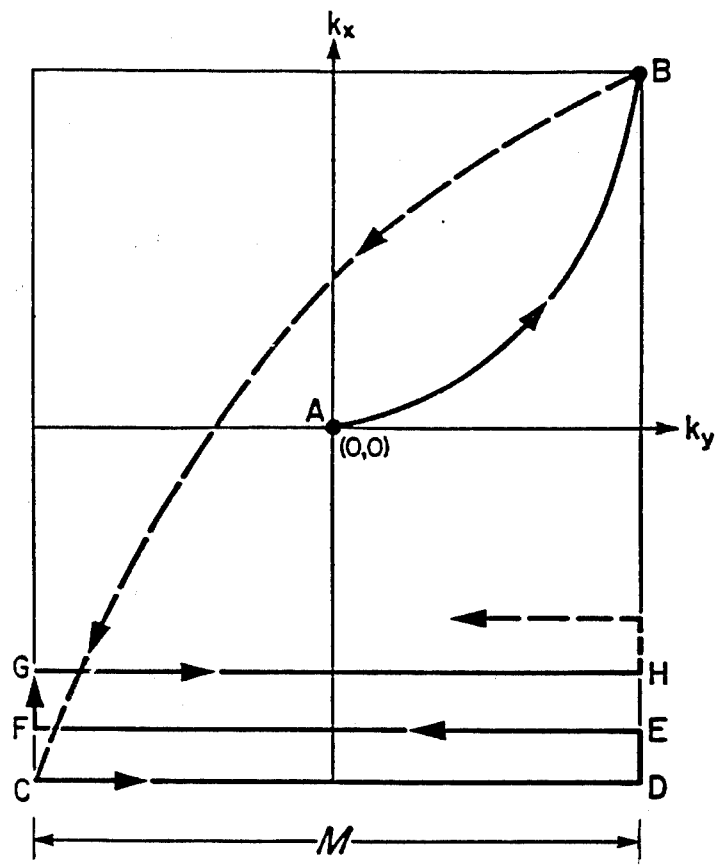
FIG. 3 shows the traverse of the spatial frequency domain in a full k-space scan.

The elements of the Instant Scan pulse sequence are shown in FIG. 2 and the corresponding full k-space trajectory depicted in FIG. 3. The acquisition window $T_{acq}$ is preceded by the application of encoding gradients $G_x$ and $G_y$ (120 and 130) in a pre-encoding interval between the 90°-180° RF pulse pair 116, 117. As shown in FIG. 3, in a full k-space acquisition, the pre-encoding gradient pulses effect a trajectory in k-space from point A (the origin) to point B. The 180° pulse causes a trajectory from point B to the conjugate position at C. Subsequent rapid oscillations of the $G_y$ gradient during the data acquisition $T_{acq}$ generate multiple gradient echoes (C-D; E-F; G-H, etc.). Between each echo, an increment of the $G_x$ gradient is applied, causing the trajectory to scan in $k_x$ (D—E; F—G, etc.) The total dimensions of k-pace sampled, N and M, are typically set to 64 and 128 points, respectively.

The rapid $k_y$ trajectories are preferably performed at a frequency of about 1.6 kHz, while a frequency of about 8 kHz may be used for the gradient $G_x(t)$. Thus it takes a time of approximately 312 microseconds to scan each $k_y$ line and 88 microseconds to move to the next $k_x$ value, for a total of 400 microseconds between each line. A 64 line scan is accomplished under a single spin-echo envelope 200 (FIG. 2) in under 26 milliseconds, which is short compared to most biological $T_2$'s and enough to essentially "freeze" even the motion of the beating heart. Alternate $k_x$ lines are time reversed and the data then are Fourier transformed using conventional 2DFFT to yield the image. To achieve as high a signal-to-noise ratio (SNR) as possible, it is preferably to operate at high static field, such as 2.0 Tesla (85.1 MHz for protons).

Partial K-Space Acquisition

As discussed in the parent application, it is possible to reduce the extent of coverage of k-space in either of the x and y directions. If there were no phase distortions introduced as the result of magnetic field non-uniformities, or by any other cause, it would be sufficient that the k-trajectory covered lines only in the positive or negative half of k-space in either the x and y direction. Corresponding data lines sampled in the opposite half of k-space would contain identically conjugated data and hence only yield data redundancy (with a corresponding SNR improvement). However, in the presence of phase distortions, corresponding data lines in opposite halves of k-space are not conjugates.

The information derived from the extension of the sampling trajectory to more than half of k-space may be used to compensate for phase errors. The extension of sampling required depends of the extent of phase errors introduced. For example, if phase errors vary only slowly over the image, (i.e, the errors have low spatial frequencies), relatively little extra trajectory needs to be sampled.

For the reasons given below, it is often desirable to collect less than a full k-space data set in the x-direction.

(1) The number of $k_x$ lines collected is reduced, hence the data acquisition time is reduced. This results in more faithful representations of moving objects. Unfortunately, the fact that less data is acquired means that the signal-to-noise ratio (SNR) in the final image is reduced. However, this can be more than compensated by the following:

(2) Because data in the Instant Scan technique is acquired following a 180° refocussing pulse, within the envelope of a spin echo, the time between the center of the spin echo envelope and the initial 90° exciting RF pulse is $2t_1$, and $t_1$ is the time between the initial 90° pulse and the 180° refocussing pulse. The maximum amplitude of the signals within the spin echo envelope decays as a result of $T_2$ relaxation, and the decay is an exponential function of $t_1$. Thus, the best SNR is obtained from the shortest $t_1$ values. In the full k-space acquisition, when the echo envelope peak corresponds in time with the central line ($K_x=0$) of k-space, M lines are acquired before the center of the echo envelope, and M-1 lines after. If M lines take $t_M$ milliseconds to acquire, clearly $t_1$ cannot be less than $t_M$. However, if less than M lines are acquired before the center of the echo envelope, $t_M$ and hence $t_1$ can be reduced. Since the time between the initial 90° pulse and the center of the spin echo envelope is TWICE $t_1$, any time saving gains which are obtained as a result of partial k-space acquisition are effectively doubled in terms of the complete high-speed experiment. Also, since the peak of the spin echo envelope now occurs earlier, less $T_2$ signal decay occurs and hence SNR is higher.

The method for performing the partial k-space acquisition, as described in the parent application, involves a modification of the encoding gradients 120 and 130 in the pre-encoding interval between the 90°-180° RF pulse pair.

Figure 4:
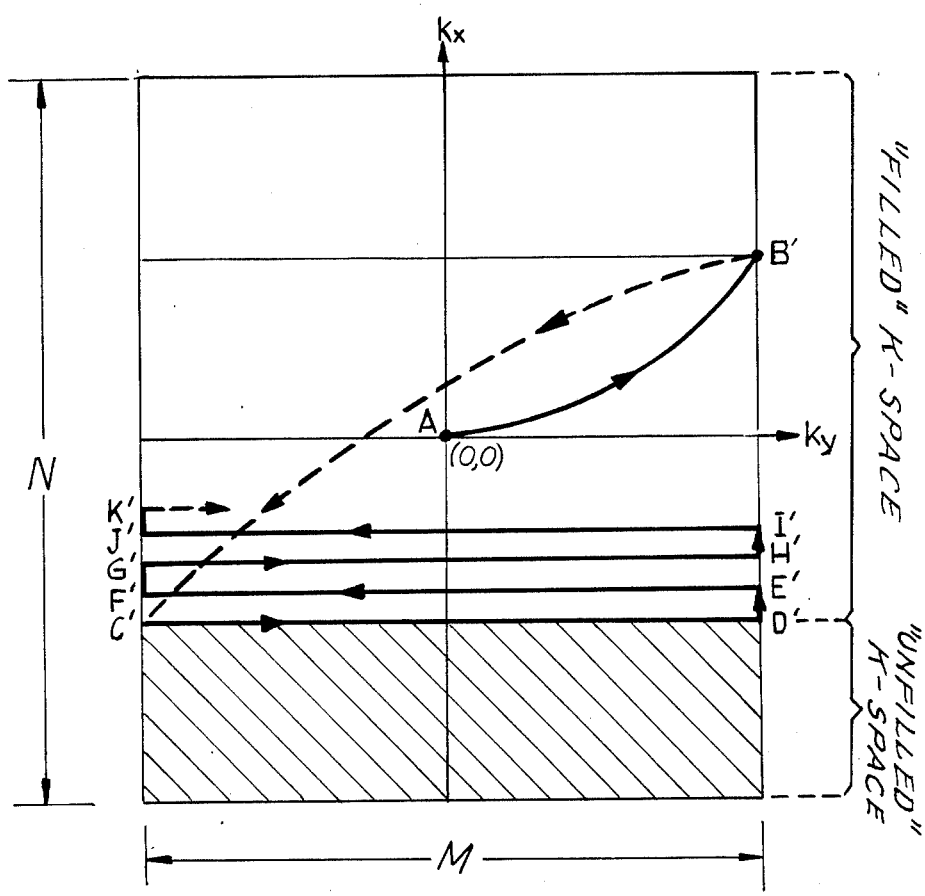
FIG. 4 shows the traverse of the spatial frequency domain in a partial $k_x$ scan.

Referring to FIG. 4, or a partial k-space acquisition in the $k_x$ direction, the area of the pre-encoding $G_x$ gradient 120 is reduced, such that the trajectory in k-space moves from A to B'. Application of the RF pulse causes relocation of the trajectory to the conjugate point C'. The data acquisiton then proceeds as before, but in this case less lines in the dimension $k_x$ of k-space are required to arrive at the final endpoint.

The reconstruction of partial k-space images in the present invention is accomplished in accordance with the following theory and algorithms:

1. Theory of reconstruction of images with slowly varying phases

The spatial distribution of an image can be described by a complex function F(x). Consider just a one-dimensional distribution (generalization for two-dimensional case is obvious). The density is given by magnitude of F(x).

Fourier transform of spatial distribution function $$F_n = \sum_x F(x) e^{-ik_n x} \quad (1)$$

represents time data obtained in 2 DFT-type NMR imaging experiments. IN (1) $x = Lm/N$ ($m=0, \ldots, N-1$), N is the number of piscels, and $k_n = 2\pi n/L$. L is the length of the imagined area. It follows from (1) that function $f_n$ is a periodical function of n with period of N. This allows to define $F_n$ outside of the range of time data obtained in an experiment.

Reversed Fourier transform of $F_n$ yields the spatial distribution function F(x):

$$F(x) = \frac{1}{N} \sum_{n=0}^{N-1} F_n e^{ik_n x} \quad (2)$$

If F(x) is real then it can be restored using time data within only half of the k-space (Fourier domain):

$$F(x) = \frac{1}{N} Re \left( 2 \sum_{n=1}^{N/2} F_n e^{ik_n x} + F_o \right) \quad (3)$$

If F(x) is not real but its phase is a slowly varying function in space, f(x) can be reconstructed from $F_n$ using just extra few Fourier harmonic in addition to half of the data in the k-space. The magnitude G(x) of F(x) can be written as $$G(x) = \phi(x) F(x) \quad (4)$$

In the Fourier domain, this equation has the form:

$$G_n = \sum_{n'} \phi_{n'} F_{n-n'} \quad (5)$$

Assume that the length 1 of $\phi(x)$ variation is much larger than piscel size L/N. Then only low spatial frequency harmonics of $\phi_{n'}$ with $|n'| \leq L/l$ are essential in (5) and the sum there can be reduced to $$G_n = \sum_{|n'|<\Delta n} \phi_{n'} F_{n-n'} \quad (6)$$

where
$L/l < \Delta n < < N$.

G(x) is a real function by definition. To restore it one only needs to know $G_n$ in the range $0 \leq n \leq N/2$. These $G_n$ can be found from (6) if $F_n$ is known in the range $-\Delta n \leq n \leq N/2 + \Delta n$ and $\phi_n$ is known in the range $-\Delta n \leq n \leq \Delta n$. Required $F_n$ must be obtained from an experiment. The following shows how $\phi_n$ can now be found from acquired $F_n$.

First introduce the function $$F(x) = \frac{1}{N} \sum_{-\Delta n \leq n \leq \Delta n} F_n e^{ik_n x} \quad (7)$$

$$= \frac{1}{N} \sum_{x'} F(x')S(x-x') = \frac{1}{N} \sum_{x'} \phi^{-1}(x')G(x')S(x-x')$$

where $$S(x) = \sin\left[\frac{2\pi}{L}(\Delta n + \frac{1}{2})x\right] / \sin\frac{2\pi}{L}x \quad (8)$$

Function S(x) has a large peak $S_o = 2\Delta n + 1$ at $x=0$. The width of the peak $\Delta x \sim L/2\Delta n + 1 < < L$. Outside of the peak S(x) has much smaller oscillating values of order of units. Unless a significant periodical structure with length $L/2\Delta n+1$ is present in the image source, most of the contribution to the sum over x' in (7) comes from the area of x' from $x-\Delta x$ to $x+\Delta x$.

Now replace argument x' in $\phi^{-1}(x')$ with x:

$$\widetilde{F}(x) \approx \frac{1}{N} \phi^{-1}(x)\Sigma G(x')S(x-x') = \phi^{-1}(x)G(x). \quad (9)$$

Function $G(x)=1/N\Sigma G(x')S(x-x')$ is a real function. $\phi(x)$ can be easily found now from (9):

$$\phi(x)=\widetilde{F}^*(x)/|\widetilde{F}(x)| \quad (10)$$

Equations (6), (7), and (10) give a solution to the problem of image reconstruction for images with slowly varying phases. A light interference effect can be observed sometimes while using this technique. It can happen when the image has a signfiicant periodical structure of the length multiple to $L/2\Delta n+1$ (see (8)).

2. Reconstruction algorithms

The following is a description of two algorithms of image reconstruction based on formulas (6), (7), and (10). We assume that acquired data fill half of the k-space plus $\Delta n$ low frequency lines and the rest of the k-space is zeroed. To use (6) it is necessary to known also $\Delta n$ high frequency lines. However, in most practical cases it is possible to neglect few high frequency lines because they are usually very small. It is also assumed that the encoding within echoes corresponds to the horizontal direction.

Algorithm I
S.1 RFT (reversed Fourier transform) in the horizontal direction.
S.2 Create an image using $2\times n+1$ low frequency lines.
S.3 Find phase function $\phi$ for S.2.
S.4 DFT (direct Fourier transform) of S.3 in the vertical direction.
S.5 Calculate $G_n$ (n=0, N/2) using (6).
S.6 RFT on $\overline{G}_n=\{G_o, 2G_n(n=1, N/2)^-, 0 (n=N/2+, N-1)\}$
S.7 Take real part of S.6.

Algorithm II
S.1 RFT in the horizontal direction.
S.2 Create an image using $2\Delta n+1$ low frequency lines.
S.3 Find phase function for S.2.
S.4 Create an image using all lines in time data.
S.5 Multiply S.4 by S.3.
S.6 DFT on S.5.
S.7 Double values of S.6 for lines n=1, n/2 and set to zero lines n=N/2+1, N−1.
S.8 RFT on S.7.
S.9 Take real part of S.8.

Both algorithms I and II are functionally completely equivalent.

Figure 5:
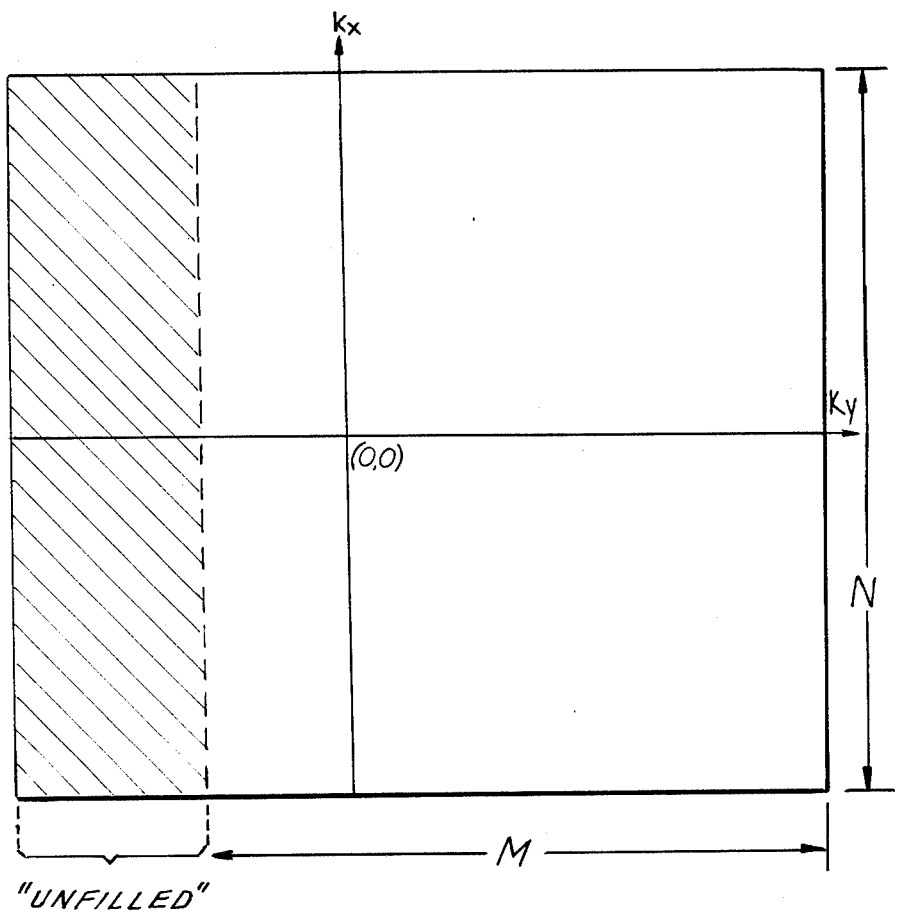
FIG. 5 shows the extent of coverage of the spatial frequency domain in a partial $k_y$ scan.

Although partial K-space acquisition was described primarily on the parent application with respect to acquiring less than 100% of the phase encoded lines in the x-direction, it is equally possible to acquire less than 100% of the y dimension of k-space by similarly reducing the area of the pre-encoding $G_y$ gradient. Since the scan in the y direction of k-space takes only approximately 300 microseconds, no appreciable $T_2$ decay occurs. By shifting the $k_y$ scan about the origin as shown in FIG. 5, while collecting the same number of points in a partial $k_y$ scan and thus keeping the signal bandwidth the same, higher spatial frequencies may be described. This variant therefore produces a higher resolution Instant Scan image in "one shot", but with a lower SNR.

Mosaic Scan Technique

Figure 7C:
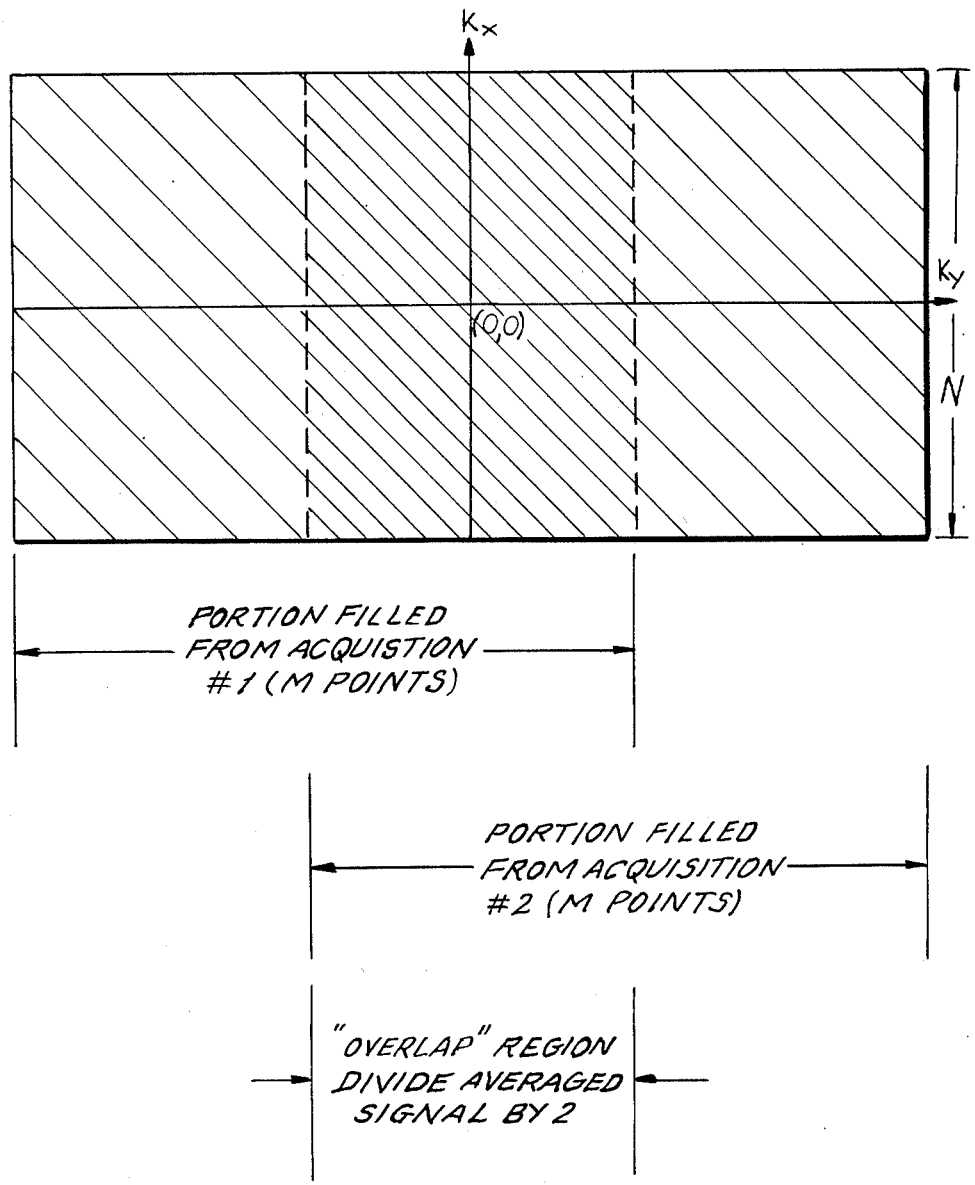

In situations where the body can be made motionless and enough time is made available to take more than "one shot", higher spatial frequencies can be described by splitting k-space into two, four or more portions, each of which is filled with a partial k-space acquisition. FIG. 6 depicts this idea with a simple "2-Tile" Mosaic scan of k-space. The total area covered in each single Instant Scan remains substantially constant (a slightly greater coverage of $k_x$ is shown in FIG. 6) but is displaced by suitable pre-encoding between the 90° and 180° RF pulses, 116 and 117, respectively, of the pulse sequence shown in FIG. 2. As shown in FIGS. 7A–7C, two acquisitions are sufficient to fill the desired area and increase resolution. The acquired k-space portions form a patchwork or "mosaic", which is pieced together prior to Fourier transformation. The resultant image is thus of higher spatial resolution than one obtained in a single Instant Scan. An overlap between the "tiles" as shown in FIG. 7C is useful as it allows for the accurate joining of the k-space sections, but is not absolutely necessary.

The reason such a straight forward extension of k-space coverage is possible is that the $k_y$ scan takes just 312 microseconds. Over such a short time there is negligible $T_2$ decay and thus the transfer function is essentially flat.

FIG. 8 shows the pulse sequence and signal for two such consecutive scans, the first labeled Scan 1, shown in the absence of $G_x$, depicts the displaced echo obtained by suitable pre-encoding. There are two choices for Scan 2, both shown, the first is to scan $k_y$ in the same direction on each $k_x$ line as in Scan 1, or second, to scan in the opposite direction which, for the 2-Tile case, results in $k_y=0$ being acquired at the same time relative to the start of each scan. In either case, each piece of $k_y$ line is always displaced less than ±156 microseconds from the center of the gradient pulse, allowing many "tiles" to be simply stuck together, each representing higher and higher spatial frequencies in the image.

Figure 9:
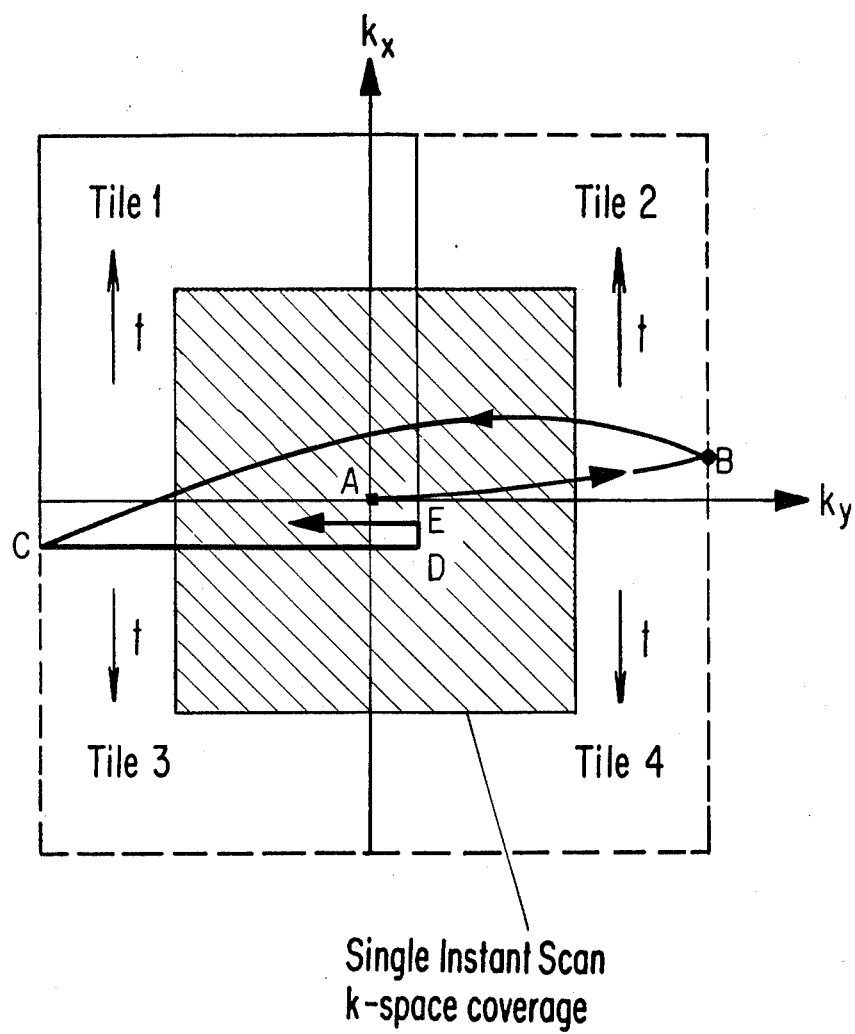
FIG. 9 shows the initial trajectory and coverage of the spatial frequency domain in a 4-Tile Mosaic Scan.

As mentioned previously, the number of points obtained in $k_x$ and $k_y$ in a single acquisition is 64×128, respectively. A factor approaching two in both the x and y directions (representing a four-fold reduction in pixel area) may be achieved by a 4-Tile Mosaic Scan, in which k-space acquisitions from each quadrant of k-space are pieced together, as shown in FIG. 9.

MESH Scan Technique

One characteristic of Mosaic Scan is that each constituent acquisiton has an asymmetric $T_2$ decay associated with it, and when the acquisitions are mosaicked together this $T_2$ decay forms a discontinuous function. This decay is most appreciable in the $k_x$ dimension, in which acquisitions occur in real time. One way to overcome this problem, if $T_2$ decay is relatively short and field inhomogeneities are not large, is to use a 4-Tile Mosaic Scan and reverse the direction of the $G_x$ gradient applied during $T_{acq}$ in opposite portions of k-space in the x-direction as shown in FIG. 9. The result is that $T_2$ decay in the x-direction is symmetric about the $k_x=0$ by scanning in opposite gradients, first along $+k_x$ and second along $-k_x$. The initial trajectory A-B-C stays around $k_x=0$. The field echo generated by the 180° pulse appears at approximately $+k_x/2$, so 4-Tile Mosaic Scan is preferred for high homogenity situations.

Alternatively, where $T_2$ is relatively long and field inhomogeneities are higher, the $k_x$ dimension may be filled by interleaving or "meshing" lines from subsequent acquisitions while the $k_y$ dimension is filled by mosaicking, called MESH (Mosaicked-Echo Scan Hybrid), shown in FIG. 10. Interleaving in the $k_x$ dimension ensures that the $T_2$ decay is a continuous function of $k_x$.

Referring to FIG. 10, in the case where coverage is doubled, the initial trajector A-B$_1$-C$_1$ proceeds to the edge of k-space. By doubling the pulsed gradient $G_x$, the step DE is doubled and the whole desired $k_x$ area is covered in a single scan but at half the density. The subsequent scan A-B$_2$-C$_2$ along $k_x$ commences with a slight offset and interleaves or "MESHes" the previous coverage. In this situation, the $T_2$ decay is represented identically to the Instant Scan with a centered and symmetric field echo about $k_x=0$. A slight asymmetry may result for short $T_2$, but in reality it is the field echo, especially at high field, that is the major concern and needs to be made symmetric. MESH does require the use of a stronger $G_x$ gradient, but this is actually not a problem, as this gradient is always significantly weaker than the y-gradient. Further, by using MESH, a factor greater than two can be obtained for the increase in $k_x$ coverage.

In both the Mosaic and MESH techniques, because the bandwidth of the signal stays fixed, the averaging effect of the scans ensures that the SNR reduces in proportion to the square root of the reduction in pixel area. Thus, to achieve equivalent SNR to a single-shot Instant Scan image, only a moderate amount of averaging is necessary. For example, for a 4-Tile mosaic or MESH, it would be necessary to perform 4 averages of a total of 16 scan altogether to regain the SNR of the single lower resolution Instant Scan.

The use of multi-slice imaging techniques in Mosaic Scan and MESH, in which multiple planes may be acquired one immediately after the other, allows for very rapid three dimensional imaging.

Direct oblique plane scanning using Mosaic Scan and MESH may be accomplished by performing the magnetic resonance studies with non-orthogonal gradients as discussed earlier with respect to the Instant Scan method.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. A method of deriving image information at high speed from an object using nuclear magnetic resonance signals in which only a portion of the spatial frequency domain (k-space) is sampled, comprising the steps of:
   (a) subjecting an object to continuous static magnetic field along an axis, said magnetic field having a strength between about 0.5 and 5 Tesla;
   (b) exciting nuclear spins in a selected plane of the object by applying to the object a first radio frequency pulse together with a first magnetic field gradient perpendicular to said plane comprising a slice selection gradient, such that free induction decay signals are produced by said excited nuclear spins in said plane;
   (c) applying to the object an encoding sequence comprising a second magnetic field gradient of predetermined magnitude having a direction parallel to said plane together with a third magnetic field gradient of predetermined magnitude having direction also parallel to said plane and perpendicular to said second gradient.
   (d) applying a second radio frequency pulse to the object;
   (e) applying to said object a further slice-selection gradient such that the total dephasing effect of the slice selection gradient applied in step (b) is as close to zero as possible;
   (f) applying a sequence comprising a series of applications to the object of said second magnetic field gradient defining phase encoding gradients and said third magnetic field defining readout gradients, said sequence of second and third magnetic field gradients being completed within a period of time less than about 100 milliseconds and resuling in a trajectory through only a portion of k-space based on the pre-determined magnitude of said second and third magnetic field gradients applied during said encoding sequence.
   (g) acquiring data to form a magnetic resonance image by sampling nuclear magnetic resonance signals output from said object during the application of said readout gradients to form a series of data values in the time domain, formatting said time domain data into modified data estimating the spatial frequencies of the object and transforming said modified data into spatial domain data for presentation as an image of the object.

2. The method of claim 1, wherein the encoding sequence of claim 1, step (c) and the phase-encoding gradient applied in claim 1, step (f) are such that more than 50% of k-space is sampled in the direction of said phase-encoding gradient, the symmetric parts of k-space sampled being sufficient to adequately represent the phase of the image.

3. The method of claim 1, wherein the encoding sequence of claim 1, step (c) and the readout gradient applied in claim 1, step (f) are such that more than 50% of k-space is sampled in the direction of said readout gradient, the symmetric parts of k-space sampled being sufficient to adequately represent the phase of the image.

4. The method of claim 1, wherein the encoding sequence of claim 1, step (c) and the gradients applied in claim 1, step (f) are such that while only a portion of k-space is sampled, the same number of points are collected as in complete sampling of k-space, so that spatial frequency response is increased while signal bandwidth is maintained.

5. The method of claim 4, wherein at least two acquisitions are performed on different portions of k-space, the acquired portions being pieced together to form a continuous coverage of k-space in a k-space mosaic prior to transformation in claim 1, step (g).

6. The method of claim 5, wherein at least four overlapping or abutting acquisitions are performed, one in each quadrant of k-space, the acquired portions being pieced together in a k-space mosaic prior to transformation in claim 1, step (g).

7. The method of claim 4, wherein a first set of two overlapping or abutting acquisitions are performed on opposite sides of k-space in the direction of the readout gradient, followed by a second set of overlapping or abutting acquisitions performed in the direction of the readout gradient, said second set of acquisitions being interleaved with said first set of acquisitions in the direction of the phase-encoding gradient.

8. The method of claim 5, wherein said first, second a third magnetic field gradients are applied in mutually orthogonal directions.

9. The method of claim 5, wherein said first, second and third magnetic field gradients are non-orthogonal, allowing for direct oblique plane scanning.

10. The method of claim 7, wherein said first, second a third magnetic field gradients are applied in mutually orthogonal directions.

11. The method of claim 7, wherein said first, second and third magnetic field gradients are non-orthogonal, allowing for direct oblique plane scanning.

* * * * *